United States Patent
Garnache-Creuillot et al.

(10) Patent No.: US 9,774,165 B2
(45) Date of Patent: Sep. 26, 2017

(54) VERTICAL EXTERNAL CAVITY SURFACE EMITTING LASER DEVICES ALLOWING HIGH COHERENCE, HIGH POWER AND LARGE TUNABILITY

(71) Applicants: UNIVERSITE DE MONTPELLIER, Montpellier (FR); CENTRE NATIONAL DE LA RECHERCHE SCIENTIFIQUE, Paris (FR); INNOPTICS, Talence (FR)

(72) Inventors: Arnaud Garnache-Creuillot, Montpellier (FR); Mikhaël Myara, Montpellier (FR); Isabelle Sagnes, Paris (FR); Grégoire Beaudoin, Charenton le Pont (FR); Laurence Ferrieres, Pessac (FR); Vincent Lecocq, Talence (FR); Stéphane Denet, Pessac (FR)

(73) Assignees: UNIVERSITE DE MONTPELLIER, Montpellier (FR); CENTRE NATIONAL DE LA RECHERCHE SCIENTIFIQUE, Paris (FR); INNOPTICS, Talence (FR)

( * ) Notice: Subject to any disclaimer, the term of this patent is extended or adjusted under 35 U.S.C. 154(b) by 0 days.

(21) Appl. No.: 15/312,586

(22) PCT Filed: May 21, 2015

(86) PCT No.: PCT/EP2015/061341
§ 371 (c)(1),
(2) Date: Nov. 18, 2016

(87) PCT Pub. No.: WO2015/177323
PCT Pub. Date: Nov. 26, 2015

(65) Prior Publication Data
US 2017/0117684 A1 Apr. 27, 2017

(30) Foreign Application Priority Data
May 21, 2014 (EP) .................................. 14305752

(51) Int. Cl.
*H01S 3/08* (2006.01)
*H01S 5/14* (2006.01)
(Continued)

(52) U.S. Cl.
CPC ................ *H01S 5/14* (2013.01); *H01S 3/139* (2013.01); *H01S 5/1039* (2013.01);
(Continued)

(58) Field of Classification Search
CPC .......... H01S 5/041; H01S 5/1042; H01S 5/14; H01S 5/18361; H01S 5/1053; H01S 5/1039; H01S 3/139
See application file for complete search history.

(56) References Cited

U.S. PATENT DOCUMENTS 6,741,629 B1 * 5/2004 Garnache ............ H01S 5/02288
372/20
7,630,417 B1 * 12/2009 Maleki .................... G02F 1/353
250/227.11
(Continued)

FOREIGN PATENT DOCUMENTS

WO 2014018942 A1 1/2014

OTHER PUBLICATIONS

"1st Workshop VeCSEL 2012", University of Montpellier 2, Oct. 17, 2012, retrieved from the Internet, <http://stem.ies.univ-montp2.fr/vec.sel/IMG/pdf/_Workshop_VeCSEL_2012_EN_.pdf>.
(Continued)

*Primary Examiner* — Kinam Park
(74) *Attorney, Agent, or Firm* — Greer, Burns & Crain, Ltd.

(57) ABSTRACT

A laser device is provided for generating an optical wave at a laser frequency, including (i) a semiconductor element having a gain region with quantum wells, the gain region being located between a first mirror and an exit region defining an optical microcavity, (ii) a second mirror distinct from the semiconductor element and arranged so as to form with the first mirror an external optical cavity including the gain region, (iii) a pump for pumping the gain region so as to generate the optical wave, wherein the optical microcavity with the gain region and the external optical cavity are arranged so that a spectral ratio between the Half Width Half Maximum (HWHM) spectral bandwidth of the modal gain and a free spectral range of the external cavity in the range of 2 to 50.

22 Claims, 9 Drawing Sheets

(51) Int. Cl.
  *H01S 5/10* (2006.01)
  *H01S 3/139* (2006.01)
  *H01S 5/183* (2006.01)

(52) U.S. Cl.
  CPC .......... *H01S 5/1042* (2013.01); *H01S 5/1053* (2013.01); *H01S 5/18361* (2013.01)

(56) References Cited

U.S. PATENT DOCUMENTS

| | | | |
|---|---|---|---|
| 8,331,008 B1* | 12/2012 | Matsko | G02B 6/29341 359/239 |
| 2002/0071463 A1* | 6/2002 | Garnache | H01S 5/141 372/45.013 |
| 2003/0112843 A1 | 6/2003 | Thornton et al. | |
| 2004/0165641 A1 | 8/2004 | Garnache et al. | |
| 2007/0116078 A1 | 5/2007 | Kim | |

OTHER PUBLICATIONS

"2nd Workshop VeCSEL 2013", University of Montpellier 2, Oct. 17, 2013, retrieved from the Internet, <http://stern.ies.univ-montp2.fr/vec.sel/IMG/pdf/Proceeding.pdf>.

* cited by examiner

Fig.18

VERTICAL EXTERNAL CAVITY SURFACE EMITTING LASER DEVICES ALLOWING HIGH COHERENCE, HIGH POWER AND LARGE TUNABILITY

BACKGROUND

The invention relates to Vertical External Cavity Surface Emitting Laser devices (VeCSEL) which allows achieving high coherence, power and tunability.

The field of the invention is, but not limited to, semiconductor laser sources for metrology and telecom applications.

Vertical External Cavity Surface Emitting Laser devices (VeCSEL) are well known devices.

They comprise basically a semiconductor element with a gain medium for generating the optical radiation and a first mirror.

The gain medium may comprise for instance quantum wells or quantum dots. It may be electrically or optically pumped.

The first mirror may comprise a succession of layers constituting a Bragg grating which reflects the optical waves around the laser frequency.

A second external mirror is provided and arranged so as to form an external optical cavity with the first mirror.

This kind of lasers has several advantages, such as a high intrinsic stability and a good tunability, which may be achieved by moving the external mirror for adjusting the length of the external cavity.

However, none of the known designs allows obtaining simultaneously high coherence, high power and large tunability.

High coherence and/or high frequency stability are usually achieved by introducing an etalon plate or an absorption cell into a long external cavity. In that case, the tunability is lost.

In order to obtain a broad tunability without mode hops, it is necessary to use a short external cavity with a large Free Spectral Range (FSR).

Finally, generating high powers leads usually to thermal dissipation problems in the semiconductor element and generation of thermal lenses (by modulation of the indices of refraction in the material) which induce a degradation of the laser performances in terms of spatial and temporal coherence.

There is a need for compact laser sources which combine high coherence, high power and large tunability, especially in the Mid-Infrared range (MIR) or in the Near Infrared Range (NIR), for applications such as sensing, spectroscopy . . . .

It is an object of the invention to provide laser sources which allow achieving high coherence, high power and broad tunability.

It is another object of the invention to provide laser sources which allow achieving high-power operation with good coherence and good stability.

It is another object of the invention to provide laser sources which allow achieving very high coherence and tunability over a broad frequency range.

SUMMARY

Such objects are accomplished with a laser device for generating an optical wave at a laser frequency, comprising:
    a semiconductor element comprising a gain region with quantum wells or quantum dots, said gain region being located between a first mirror and an exit region defining an optical microcavity,
    a second mirror, distinct from the semiconductor element, and arranged so as to form with the first mirror an external optical cavity including the gain region,
    means for pumping the gain region so as to generate the optical wave,
    characterized in that the optical microcavity with the gain region and the external optical cavity are arranged so that the spectral ratio between the Half Width Half Maximum (HWHM) spectral bandwidth of the round trip net modal gain and the free spectral range of the external cavity is in the range of 2 to 50, and in that the ratio between the light power inside the optical microcavity and the light power inside the external cavity is lower than or equal to 1

According to some modes of realization, the device of the invention may comprise a spectral ratio in the range of 11 to 50, which leads to an easier design, less complicated to implement.

According to some other modes of realization, the device of the invention may comprise a spectral ratio in the range of 2 to 9 which is more robust for avoiding mode hops and long-term stability, and also for obtaining broad tenability.

The Half Width Half Maximum (HWHM) spectral bandwidth of the modal gain corresponds to the round-trip net modal gain bandwidth (equal to modal gain minus modal intracavity optical losses). The round trip modal gain corresponds to the gain of the material (quantum wells or quantum dots for example) multiplied by the relative light intensity (pointing vector flux) compared to the incident medium (air here). The microcavity characteristics, and so the spectral filtering bandwidth and the relative light intensity, are given by the light field spatial confinement factor (wavelength dependent), which is calculated through the ratio between the pointing vector flux on the gain layers and the one in the incident medium (air here). The modal gain is thus the product of the material gain (quantum wells or quantum dots for example) with the light field spatial confinement factor. The round trip modal losses corresponds to the material losses, or/and output coupler losses multiplied by the relative light intensity (pointing vector flux) compared to the incident medium (air usually). Both modal gain and modal losses are wavelength dependent, which will define the net modal gain bandwidth in the following. The gain confinement factor also defines the ratio between light power/intensity on gain medium and outside.

The free spectral range of the external cavity is the spectral range separating two consecutive resonance frequencies of the external cavity.

Thus, the semiconductor element with its first mirror and the second mirror constitute a laser cavity with a gain medium formed by the gain region with the quantum wells.

The means for pumping the gain region may comprise electrical pumping means.

According to some preferred modes of realization, the means for pumping the gain region may comprise optical pumping means.

The first mirror may comprise a Bragg Mirror with a succession of layers of higher and lower indices of refraction, so as to have a high reflectivity at the laser frequency.

It may for instance comprise 10 to 40 pairs of high/low index layers made of semiconductor or dielectric materials. It could be a hybrid mirror with a gold layer or coating added.

The second mirror may have a transmittance in the order of 0.1% to 15%.

The gain region may comprise 3 to 24 quantum wells separated with barriers.

According to some less preferred modes of realization, the gain region may comprise quantum dots.

With optical pumping, the microcavity with the gain region may be several $\lambda/4$ layer thick ($\lambda$ being the laser wavelength), to allow absorption of the optical pump power in the barriers, or alternatively directly in the quantum wells (or quantum dots) to reduce heating. The quantum wells longitudinal distribution along the barrier layers may be optimized for homogeneous excitation of these quantum wells.

The thickness (or the length) of the gain region may be limited to only a few laser wavelengths to avoid the appearance of longitudinal spatial mode competition.

As set forth before, the invention aims at providing lasers which allow achieving high power, narrow spectral linewidth, low intensity noise and tunability.

It has been surprisingly discovered in the frame of the invention that the best trade-offs between these characteristics may be obtained with VeCSEL laser architectures in which the spectral ratio between the HWHM spectral bandwidth of the modal gain and the free spectral range (FSR) of the external cavity is in the range of 2 to 9 (robust), or in the range of 9 to 50 (but possible sensitivity to non-linear mode interactions at very high intracavity power).

This range of parameter allows keeping single frequency operation stable and robust.

This range of parameters allows also keeping characteristic time for single longitudinal mode operation much shorter than one millisecond, typically in the order of few microseconds, in order to avoid technical or physical perturbations.

The spectral bandwidth of the modal gain depends on the gain curve of the gain medium (the quantum wells) and on the resonance (or anti-resonance) spectral characteristics of the micro-cavity.

The free spectral range of the external cavity depends on its optical length.

So, according to the invention, keeping these parameters in relation as described before leads to optimal design trade-offs of VeCSEL lasers assemblies with specifications in terms of power, spectral linewidth, intensity noise and tunability which are not achieved by prior art devices.

As it will be explained, these design constraints may lead to a large variety of specific designs with different trade-offs and optimizations between the above mentioned specifications (for instance power, tunability . . . ). However, they ensure that the trade-offs are optimal.

According to some modes of realization, the device of the invention may comprise:
  a microcavity with a length adjusted so as to meet an anti-resonance condition at the laser frequency; and/or
  an exit region with a spectral filter arranged so as to enhance the anti-resonance factor of the micro-cavity around the laser frequency.

The device of the invention may further comprise an external optical cavity with a length adjusted to be smaller than or equal to 2 mm.

Alternatively, the device of the invention may further comprise an external optical cavity with a length smaller than 0.5 mm.

These modes of realization allow obtaining a fast and broadly continuously tunable laser cavity, with tuning repetition rate up to few MHz.

For instance, for an external cavity length of 0.3 mm, the free spectral range FSR=500 GHz.

Applying an antireflection coating on the exit region and/or adjusting the length of the microcavity to meet an anti-resonance condition at the laser frequency allows obtaining a broadband gain, with a bandwidth in the order of 5 to 10 THz HWHM.

In these conditions, it is possible to achieve broad continuous laser frequency tunability (without mode hops) over more than 500 GHz at constant output power by varying the length of the external cavity, and even more by also tuning the semiconductor component temperature.

Of course, broader tunability may be achieved with mode hops.

Meeting the anti-resonance condition also allows reducing the electric field intensity in the semiconductor structure, for modal optical losses reduction (external cavity finesse increase, lower pass band filter of the intensity noise with lower cavity cut off frequency), thermal lens effect reduction and thermal noise induced frequency noise reduction. With an anti-resonant design, the finesse can be increased by a factor of 3, the thermal lens effect reduced by 3, and the frequency noise spectral density reduced by 10.

The antiresonance strength can be further increased by designing an anti-resonant microcavity. The length of the microcavity is still adjusted to an odd number of $\lambda/4$ layers (such as for the simple anti-resonant microcavity), but the exit region further comprises a bragg mirror with about 1 to 15 pairs of layers of higher and lower indices of refraction (instead of a simple transition between mediums of different indices of refraction such as for the simple anti-resonant microcavity).

The device may further comprise a capping layer to protect the semiconductor structure (GaAs, InGaP, Dielectric), whose thickness is included in the last top layer.

Of course, according to some other modes of realization, a spectral filter may comprise an element distinct from the semiconductor element.

These modes of realization allow doing free running lasers with high output power (of 1 W or more) and very narrow linewidths, especially using the pump stabilization scheme for reduced thermal noise. The mechanical noise would be prevented from an integrated glued packaging.

According to some modes of realization, the second mirror of the device may be a concave mirror.

The device of the invention may further comprise tuning means for moving the second mirror so as to change the length of the external cavity and/or coarse tuning means so as to change the gain chip temperature so as to change the gain peak wavelength.

The tuning means may comprise a (metallic) flexible part actuated by a piezo-electric actuator.

In particular, an embodiment of the present invention may include a specifically designed flexible part in order to carry out the cavity length (and thus wavelength) tunability. Indeed, the use of such a part leads to a quasi-monolithic cavity construction, which is a great advantage for laser operation stability. The said flexible part is possibly metallic and partially thinned.

An actuator is inserted in the flexible part in order to tune the optical cavity length. In a preferred embodiment of the invention, a ceramic piezo-electric actuator is used.

According to some modes of realization, the device of the invention may comprise only free space between the exit region of the semiconductor element and the second mirror.

Alternatively, the device of the invention may be filled with a transparent material (at least at pump and laser wavelength) between the exit region of the semiconductor element and the second mirror. The material may be gaseous, liquid or solid.

It is indeed an advantage of the invention that the configuration of the semiconductor device with the microcavity and of the external cavity allows obtaining high quality beams without adding any other element into the external cavity.

So, the cavity is also available for inserting other elements for specific functions which are not directly related to the generation of the high-quality laser beam (such as beam shaping elements, absorption cells for analysis devices . . . ).

According to some modes of realization, the device of the invention may comprise a semiconductor element based on one of the following substrates:

a III-V semiconductor;
a IV semiconductor;
a metallic type substrate;
a gallium antimonide (GaSb) substrate;
a gallium arsenide (GaAs) substrate.

It may be done by epitaxy, using for instance a MetalOrganic Chemical Vapour Deposition method (MOCVD) or Molecular beam Epitaxy.

For thermal management, a substrate with a high thermal conductivity may be used, such as for instance a semiconductor or gold or Diamond or Sapphire or Silcon Carbide substrate.

The device of the invention may further comprise optical pumping means with a pump laser arranged so that its beam falls on the exit region of the semiconductor element at or around (for instance within ±5 degrees) the Brewster angle.

Thanks to that configuration, most of the optical power of the pump is transmitted into the gain region.

The pump laser may comprise at least one multimode continuous laser diode.

As explained before, the pump energy may be either absorbed in the quantum well (or quantum dot) barrier material or directly in the quantum well (or quantum dot) for thermal load reduction.

Thus, for example for a GaAs based VeCSEL, a 808 nm pump diode may be use to be absorbed in the GaAs barriers for 1-1.3 µm VECSEL emission. Alternatively, a 980 nm pump diode may be use to be directly absorbed in the quantum wells.

The pump laser may be arranged to that its beam covers an area of 25 µm$^2$ or more in the exit region.

Alternatively, the pump laser may be arranged to that its beam covers an area of 100 µm$^2$ or more in the exit region.

Several pump diodes may be arranged to pump the microcavity, in order to increase the launched pump power.

Thanks to the very narrow gain region (which prevents spatial modes competition) and the intrinsically broadband gain curve of that gain region, a low-cost multimode laser diode may be used for the pump. It has the advantage of allowing covering a relatively large surface on the exit region with an optical power distribution which is more homogeneous than with a single mode laser. So, a broader area of the quantum wells may be used, which allows generating more optical power. The heat dissipation and the thermal lens effects are also limited, which allows improving the quality of the laser beam generated.

According to some modes of realization, the device of the invention may further comprise stabilization means for stabilizing the intensity of the pump laser beam.

The stabilization means may comprise a photodiode for measuring the intensity noise of the pump laser beam and a control loop for driving the pump laser so as to cancel said intensity noise.

Usually, the laser stabilization techniques (for instance for limiting the intensity noise) involve a measurement of the generated laser beam and a regulation loop acting on internal components of the laser such as the pump. So the whole laser is enclosed in a closed loop. These kinds of configurations have the drawback of leading to complex devices with a limited versatility (for instance limited tunability . . . ) and do not permit to take benefit on feedback based measurements (for example Doppler velocimetry systems).

Thanks to the intrinsic qualities of the semiconductor device with the microcavity and of the external cavity optimized as described previously, it is not necessary to stabilize the laser of the invention with such closed loop.

The control of the intensity noise can be done with a control loop just on the pump laser. The rest of the laser set-up is intrinsically stable enough to achieve good performance in these conditions.

It is thus a key advantage of the invention that the laser assembly is an open-loop, free running system. So, in addition to a very high beam quality, it provides also a good versatility and can be easily adapted to a large variety of configurations.

In particular, large tuning ranges are easily achieved because there is no global control loop to take into account.

According to some modes of realization, the semiconductor element is arranged so as to allow generating a linearly polarized beam. That linear polarization is obtained by using the slight gain dichroism between the semiconductor crystal axis, and more specifically between [110] and [1-10] crystal axis.

According to some modes of realization, the device of the invention further comprises electrical pumping means for injecting a pump current in the semiconductor element.

According to another aspect of the invention, a method is proposed for designing a tunable and robust laser device of anyone of the mode of realization of the invention, the method comprising at least one of the steps of:

adjusting in the range of 2 to 50 the spectral ratio between the Half Width Half Maximum (HWHM) spectral bandwidth of the modal gain and the free spectral range of the optical microcavity and the external cavity, and/or adjusting the ratio between the light power inside the optical microcavity and the light power inside the external cavity in order to be lower than or equal to 1, and/or adjusting the length of the laser optical microcavity so as to meet an anti-resonance condition, and/or designing the external cavity in order to be smaller than or equal to 2 mm.

The modal gain bandwidth is based on the confinement factor properties on gain layers and material gain properties.

First the confinement factor can be modified by varying the optical layers properties, as the gain region thickness and/or the top layers properties located before incident medium for example, the incident medium being air for example, and the top layers being a Bragg grating with a predetermined pair number of layers for example. So by varying the microcavity finesse and center wavelength for resonance or anti-resonance conditions, and alternatively the gain layer position relatively to light field antinodes, one can tune both modal gain bandwidth and the ratio of light power inside/outside the gain region.

Secondly, the material gain bandwidth can be modified by changing for example (i) the atomic composition of the material used in the semiconductor element (semiconductor, doped crystal or fiber . . . ) and/or (ii) the excitation density (for semiconductor materials) and/or (iii) the morphology (thickness, geometry like dots, dash, well . . . with semiconductor technologies).

Also the modal losses filter bandwidth can be adjusted to vary the net modal gain bandwidth (thanks to a metallic absorbing nanometer thick layer on the gain structure and located on or closed to a light field node at center wavelength, an external etalon element, an external fibre based DBR mirror or, output coupler, external volume Bragg grating mirror . . . ).

Typically, the modal gain bandwidth with the microcavity properties can vary from 100 GHz to 10 THz. The material gain bandwidth with semiconductor can vary from 1 THz to 30 THz. Typically, the modal losses bandwidth can be varied from 30 GHz to 10 THz with the different technologies.

According to one other embodiment, the step of adjusting the ratio between the light power inside the optical microcavity and the light power inside the external cavity may comprise the adjustment of the confinement factor.

And according to another embodiment, the step of meeting the anti-resonance condition may be obtained by adjusting the total optical length of the microcavity to be an odd number of $\lambda/4$ layers and/or by placing a Bragg mirror onto the exit region to further enhance the light field intensity reduction (antiresonance of the microcavity). The intensity ratio can be varied also by choosing a design wavelength in-between a resonant and an antiresonant wavelength condition.

BRIEF DESCRIPTION OF THE DRAWINGS

The methods according to embodiments of the present invention may be better understood with reference to the drawings, which are given for illustrative purposes only and are not meant to be limiting. Other aspects, goals and advantages of the invention shall be apparent from the descriptions given hereunder.

DETAILED DESCRIPTION

Figure 1:
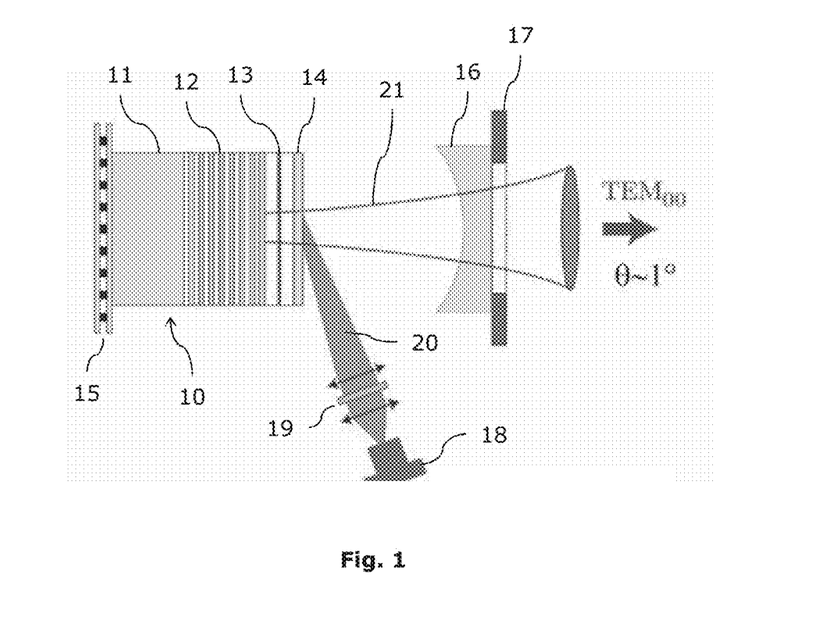
FIG. 1 shows a schematic view of the laser assembly.

With reference to FIG. 1, we will describe a general mode of realization of the invention which allows manufacturing laser devices in the form of compact and stable laser modules.

The laser device comprises a semiconductor element 10.

This semiconductor element 10 is mounted on a heat sink 15 with Peltier elements for stabilizing and controlling the temperature.

The semiconductor element 10 comprises a succession of layers grown by epitaxy.

These layers comprise:
a base substrate 11 (either native or host substrate),
a first high-reflectivity Bragg mirror 12,
a gain region 13 with the quantum wells,
an exit region 14 with a protective layer.

The laser device further comprises a second mirror 16 of a concave shape which forms with the first mirror 12 an external optical cavity. That second mirror 16 has a few percent of transmittance so as to allow the laser beam 21 to exit the laser.

Figure 2:
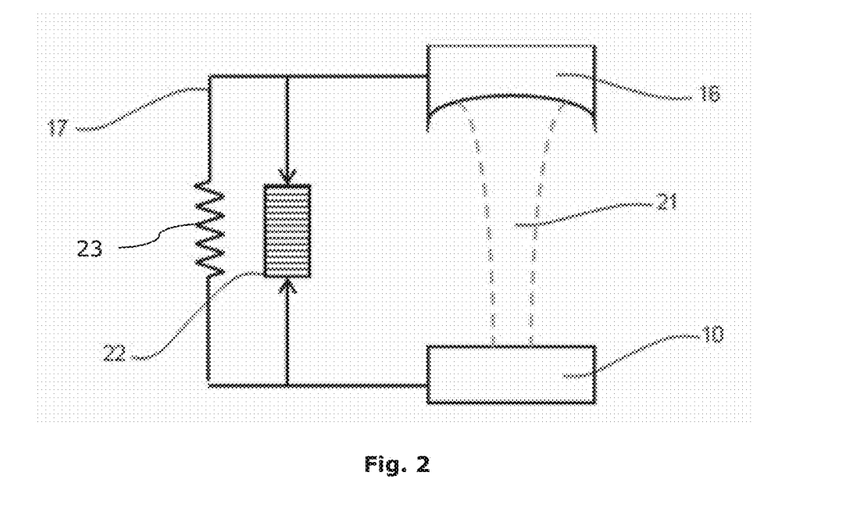
FIG. 2 shows a schematic view of the mechanical concept of the optical cavity control.

With reference to FIG. 2, the second mirror 16 is mounted on a high stability mechanical mount 17. The mount 17 is equipped with a piezoelectric actuator 22 which allows moving the second mirror 16 relative to the semiconductor element 10 so as to vary the length of the external cavity.

The mount 17 further comprises a flexible part 23 that is elongated by the piezo-electric actuator 22.

The mount 17, which is globally of a U shape, holds also the semiconductor element 10. This set-up is a key element to improve the stability of the cavity and get a stable operation of the laser.

The laser device further comprises a continuous, linearly polarized multimode laser diode 18 with beam shaping optics 19 for generating an optical pump beam 20.

The assembly is arranged so that the pump beam 20 is incident on the exit region 14 of the semiconductor element at the Brewster angle, so as to have a maximum of coupling into the gain region 13.

The first high-reflectivity Bragg mirror 12 is of course reflective for the laser wavelength. It may be also reflective, or partially or totally transparent for the pump wavelength.

The elements comprised in the exit region 14 as described below are partially or totally transparent for the pump wavelength.

The device of the invention further comprises stabilization means for stabilizing the intensity of the pump beam 20. These stabilization means comprise a wide-band low-noise photodetection system (comprising a photodiode located on the back side of the laser diode 18 and a low noise amplifier) for measuring the intensity noise of the pump beam 20, a low noise high current wide-modulation-band driver for driving the pump laser diode 18, and a wide-band control loop so as to cancel the intensity noise.

The noise reduction may be then limited only by the partition noise (that is the noise due to the relative variations of amplitude of the modes), and can lead—for example—to noise reduction down to −160 dB/Hz at low frequencies (<100 kHz) for 1 mA (<<1%) detected by the photodiode. The overall system benefits then of low 1/f noise in multimode pumps and low 1/f noise in the low frequency transimpedance circuit conditioning the photodiode signal, combined to a strong integrator gain stage in the servo-loop.

The external optical cavity is called "external" in the sense that it comprises a part which is distinct from the semiconductor element 10. In does not need any extra component inside for the proper operation of the laser. Its external part is filled with air.

The device allows easy adjustment of the laser frequency by moving the second mirror 16 with the piezo actuator 23 so as to vary the length of the external cavity.

The laser frequency may also be varied by varying the temperature of the semiconductor element 10 with the Peltier elements of the heat sink 15.

The present invention aims at providing different laser design that leads to single frequency, high power and fast tunable over a broad frequency range, with tuning repetition rate up to few MHz. Such lasers are obtained thanks to some parameters that have to be carefully adapted in order to reach those performances:
- a short external cavity, whose length is preferably comprised between 0.2 mm and 2 mm, and/or
- a high finesse, typically higher than 100, and preferably higher than 600, in order to reduce optical losses onto the first and the second mirror, and reduce the laser cavity cutoff RF frequency (FSR×losses/2τ) for the intensity fluctuations, at a value below 1 GHz of great interest for telecom, opto-hyper, or fundamental applications and/or
- optical losses smaller than 1% over a round-trip inside the cavity, and/or
- a thermal lens impact reduced thanks to a ratio between the light power inside the optical microcavity and the light power inside the external cavity lower than or equal to 1, typically in the range of 0.1 to 0.9, and/or
- a spectral ratio between the Half Width Half Maximum (HWHM) spectral bandwidth of the modal gain and the free spectral range of the optical microcavity and the external cavity in the range of 2 to 50 in order to provide a robust single frequency emission with a generation time in the order of the microsecond.

A possible design for single frequency operation, is to use a long cavity that is much more longer than 1 mm instead of a short cavity for long photon life time (lower laser cutoff frequency of intensity fluctuations, lower frequency noise), allowing reduction of the finesse, to the detriment of spectral tuning repetition rate and achievable range.

Figure 3:
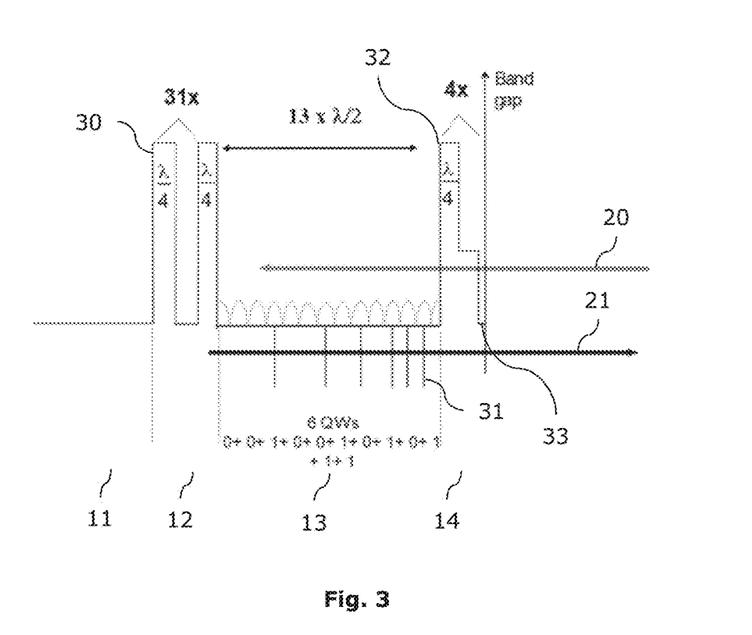
FIG. 3 shows a schematic view of the semiconductor element according to a first mode of realization, in the form of a graph with the elements represented in function of their band gap energy.

The semiconductor element is based on a GaAs substrate.

It comprises a high-reflectivity Bragg mirror 12 with 31.5 pairs 30 of AlAs/GaAs layers of $\lambda/4$ thickness each ($\lambda=1000$ nm), or in other words 32 layers of AlAs alternating with 31 layers of GaAs.

The active region or the gain region 13 is mainly made of GaAs, and has a thickness of $13\times\lambda/2$ ($\lambda=1000$ nm). It comprises six quantum wells 31 made of $GaAsP_{0.06}$/InGaAs/$GaAsP_{0.06}$ layers emitting at ~980 nm at low excitation power and at room temperature. The quantum wells 31 are distributed so as to be located along the maximum of intensity or the anti-nodes of the stationary wave which establishes into the active region, in such a way that the carrier density is the same in all the quantum wells 31. So their repartition is as follows, starting from the entrance side of the pump beam 20:

1 1 1 0 1 0 1 0 0 1 0 0, where "1" and "0" represent respectively anti-nodes with and without quantum wells.

The exit region 14 comprises a spectral filter in the form of a partial Bragg mirror made of four pairs 32 of AlAs/AlGaAs_18% layers of $\lambda/4$ thickness each ($\lambda=1000$ nm).

It further comprises a GaAs caping layer 33 of ~10 nm comprised in the last $\lambda/4$ layer of AlGaAs.

The spectral filter forms with the first mirror 12 a microcavity.

Figure 4:
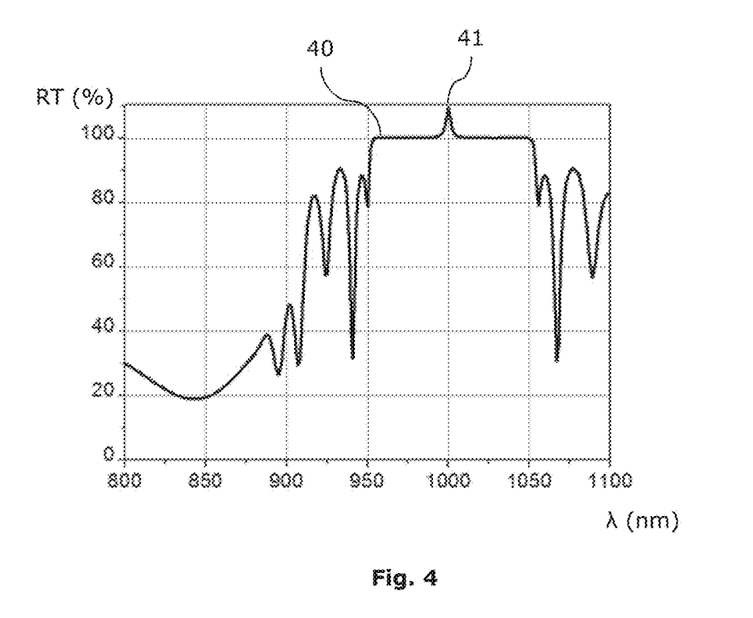
FIG. 4 shows the reflectivity or the gain spectrum in percents, in function of the wavelength, obtained with the semiconductor element of FIG. 3.

FIG. 4 shows a calculated reflectivity or gain spectrum 40 of the GaAs based structure with broadband InGaAs/GaAsP quantum wells emitting at 1 μm. It is calculated for a pump intensity of 2 kW/cm2.

The gain spectrum 40 results from the intrinsic gain curve of the quantum wells, modified by the resonance characteristics of the microcavity formed by the spectral filter and the first mirror 12.

Figure 5:
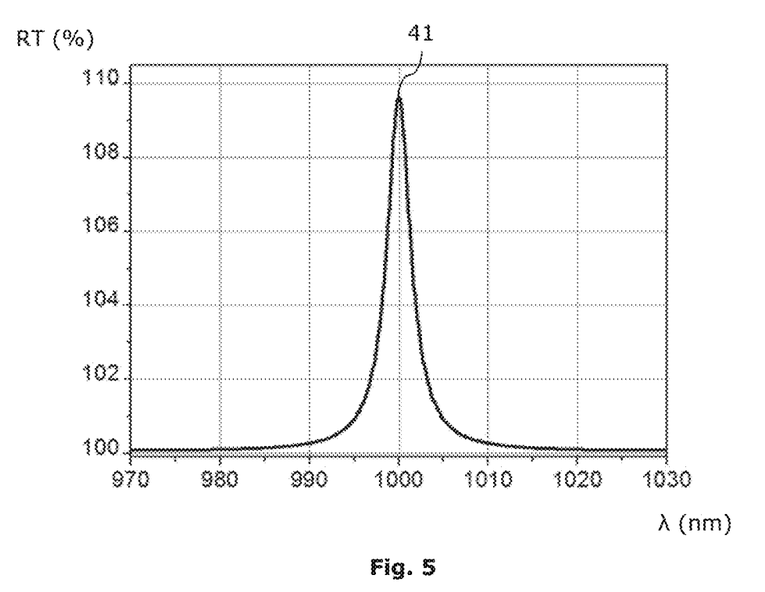
FIG. 5 shows a detailed view of the gain spectrum of FIG. 4 around the laser frequency.

FIG. 5 shows an enlarged view 41 of the gain curve around the operating wavelength $\lambda$.

As it can be seen, the spectral filter has the effect of spectrally limiting the gain around the operating wavelength $\lambda$.

In the example of FIG. 4 and FIG. 5, the net bandwidth of the gain filter is smaller than 300 GHz (HWHM). In this mode of realization, the length of the external cavity is about 15 mm, which leads to a free spectral range FSR=10 GHz.

So, the spectral ratio between the Half Width Half Maximum (HWHM) spectral bandwidth of the modal gain and the free spectral range of the external cavity is equal to 30.

Figure 6:
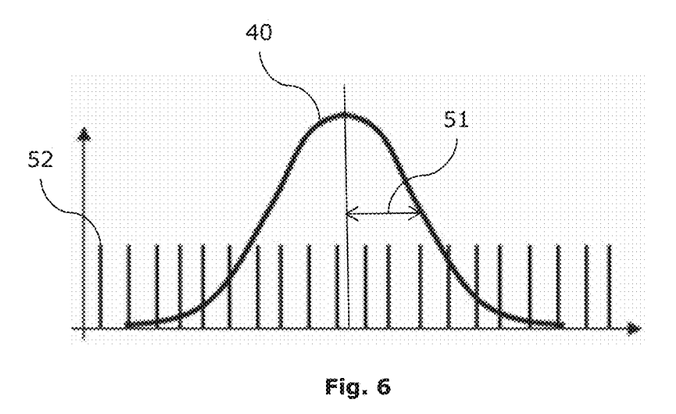
FIG. 6 shows the modes of the external cavity and the gain spectrum.

FIG. 6 illustrates the spectral gain curve 40 and the modes 52 of the external cavity.

The FSR is the frequency interval between two consecutive cavity modes 52 located around the operating frequency.

The bandwidth 51 of the gain corresponds to the half width at half maximum (HWHM, −3 dB) of the spectral gain curve.

The second mirror is a concave mirror with a transmittance T=5%

This mode of realization allows achieving:
- moderate single frequency output Power, much lower than 1 W with GaAs based materials, due to stronger thermal lens parasitic effect in the resonant enhanced microcavity, as well as stronger non-linear mode coupling in the gain leading to possible multimode irregular dynamics;

good spatial coherence with beam quality M2<1.5 but only at moderate power due to thermal lens parasitic effect;

class A laser dynamics with no relaxation oscillations;

good temporal coherence with a RIN cavity cutoff frequency of 100 MHz, shot noise limit <<100 MHz, linewidth quantum Limit <1 Hz;

a Side Mode Suppression Ratio at quantum limit >55 dB a Polarization Extinction Ratio at quantum limit >65 dB a medium finesse cavity >100 a fine continuous frequency tuning capability thanks to the Piezo-based cavity length tuning (FSR=10 GHz), but reduced by more than 10. In addition the tuning repetition rate is much lower due to longer photon life time (>10)

a much reduced coarse spectral tuning range <0.5 THz, due to a weakly tunable microcavity filter by varying the temperature of the semiconductor element 10 (typically 4 times less than gain tuning in semiconductors), and power roll over due to gain-filter spectral mismatch.

Figure 7:
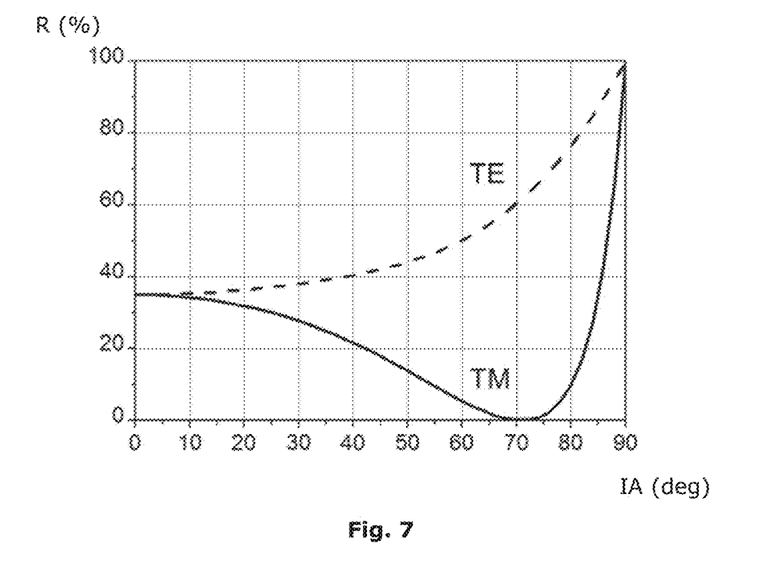
FIG. 7 shows the reflectivity (in percent) as a function the incident angle (in degrees) at a pump wavelength of 808 nm of the resonant structure with typical gain/absorption in the active region, for TM or TE polarized pump beams.

FIG. 7 shows the reflectivity (in percent) as a function of the incident angle (in degrees) at a pump wavelength of 808 nm of the resonant structure with typical gain/absorption in the active region, for TM or TE polarized pump beam 20. It illustrates how to obtain a maximum of coupling of the pump beam 20 into the gain region 13 by arranging the angle of incidence of the pump beam at the Brewster angle.

Figure 8:
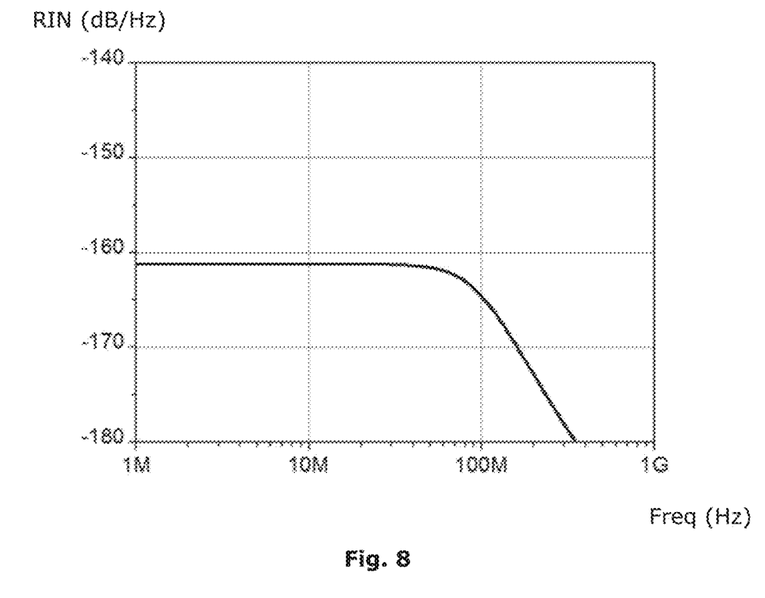
FIG. 8 shows an example of Relative Intensity Noise (dB/Hz) at quantum limit (pump RIN<−160 dB) as a function of radio frequency (Hz) of a 10 mm long resonant VECSEL emitting 100 mW at 1 µm.

FIG. 8 illustrates an example of Relative Intensity Noise (dB/Hz) at quantum limit (pump RIN<−160 dB) plotted in function of the radio frequency RF (Hz), obtained with a device of the invention with a 10 mm long resonant cavity emitting 100 mW at 1 µm. It can be seen that the shot noise for 1 mA of photocurrent is reached at any RF frequency.

Figure 9:
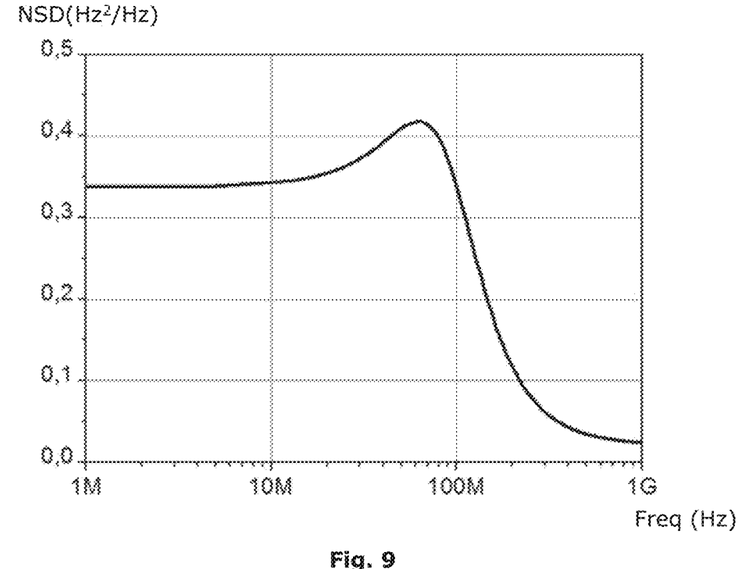
FIG. 9 shows an example of Frequency Noise Spectral density ($Hz^2$/Hz) at quantum limit as a function of radio frequency (Hz) of a 10 mm long resonant VECSEL emitting 100 mW at 1 µm.

FIG. 9 illustrates an example of Frequency Noise Spectral density (Hz$^2$/Hz) at quantum limit plotted in function of the radio frequency RF (Hz), obtained with a device of the invention with a 10 mm long resonant cavity emitting 100 mW at 1 µm. The fundamental laser linewidth (FWHM) is thus 1 Hz here.

Figure 10:
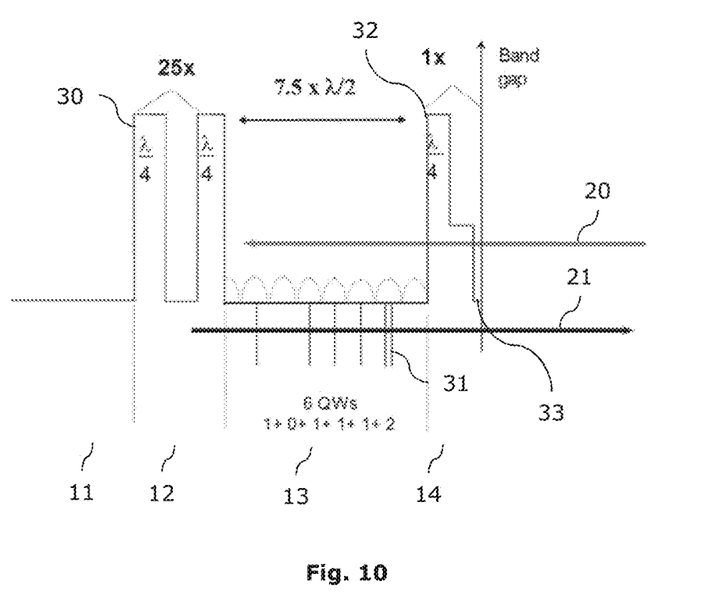
FIG. 10 shows a schematic view of the semiconductor element according to a second mode of realization in an enhanced anti-resonant microcavity configuration, in the form of a graph with the elements represented in function of their band gap energy.

With reference to FIG. 10, we will now present a mode of realization of the invention for doing a fast and broadly continuously tunable laser of high finesse, with reduced thermal lens strength and with a tuning repetition rate up to few MHz.

In this mode of realization, a GaSb substrate is used for obtaining a laser emitting at λ=2.3 µm (also valid at 1 µm or 1.5 µm with InP). This kind of laser is very useful for instance for spectroscopy applications (at 1 µm range for seeding, 0.85 µm for atomic clock).

The design is similar to the one described in relation with FIG. 1, FIG. 2 and FIG. 3, so only the differences will be described.

The exit region 14 of the semiconductor element does not comprise a spectral filter.

According to a first variant, the exit region 14 of the semiconductor element comprises instead an antireflection coating.

According to a second variant, the length of the microcavity formed by the first mirror 12 and the exit region 14 is adjusted so as to obtain an anti-resonance condition. That condition is reached by adjusting the length of the microcavity to an odd number of λ/4 layers. The exit region 14 of the semiconductor element comprises a simple transition between mediums of different indices of refraction (caping layer 33 and air) to reflect part of the optical wave.

According to a third variant, an enhanced anti-resonant microcavity is built. The length of the microcavity is still adjusted to an odd number of µ/4 layers such as for the simple anti-resonant microcavity, but the exit region 14 further comprises a bragg mirror with about 1 to 15 pairs of layers of higher and lower indices of refraction (instead of a simple transition between mediums of different indices of refraction such as for the simple anti-resonant microcavity). This is the variant shown on FIG. 10.

Figure 11:
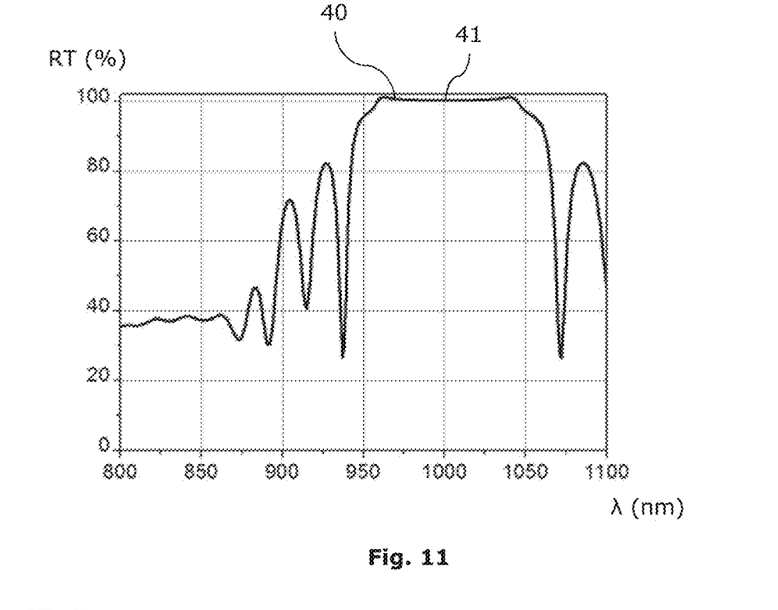
FIG. 11 shows the reflectivity or the gain spectrum in percents, in function of the wavelength, obtained with the semiconductor element of FIG. 10.

FIG. 11 shows a calculated reflectivity or gain spectrum 40 (in percent) in function of the wavelength (nm) of an enhanced anti-resonant structure such as shown on FIG. 10.

As explained before, the gain spectrum 40 results from the intrinsic gain curve of the quantum wells, modified by the enhanced anti-resonance characteristics of the microcavity formed by the partial Bragg mirror of the exit region 14 and the first mirror 12.

Figure 12:
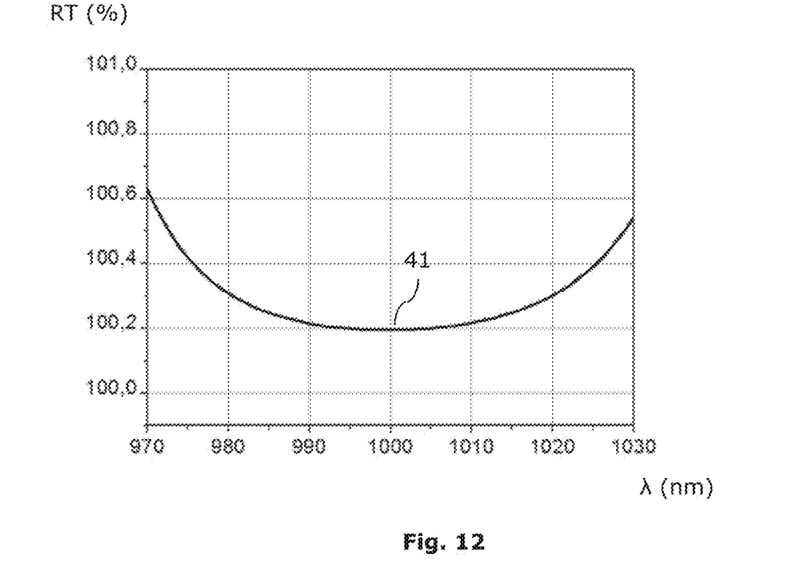
FIG. 12 shows a detailed view of the gain spectrum of FIG. 11 around the laser frequency.

FIG. 12 shows an enlarged view 41 of the gain curve around the operating wavelength λ.

The result of both first, second and third variant is to obtain a broad spectral gain curve, which corresponds to the spectral gain curve of the quantum wells in the case of the anti-reflective coating, a broader curve when using the anti-resonance condition, and a still broader curve when using the enhanced anti-resonance condition (FIG. 11 and FIG. 12).

It also allows reducing the Laser field intensity in the structure to increase the cavity finesse, reduce the thermal lens strength and thermal noise induced frequency noise. The finesse can be for instance increased by a factor of 3 for an anti-resonant design, the thermal lens reduced by 3, and the frequency noise spectral density reduced by 10 compared to a design with an antireflection coating.

By doing so, a HWHM gain bandwidth of 5 to 10 THz may be achieved.

The length of the external cavity is set around 0.3 mm, which corresponds to a FSR of 500 GHz.

So, the spectral ratio between the Half Width Half Maximum (HWHM) spectral bandwidth of the modal gain and the free spectral range of the external cavity is between 10 and 20.

The second mirror 12 is a concave mirror with a transmittance T=1% (or 0.3% for an anti-resonant design).

This configuration allows broad continuous laser frequency tunability (without mode hops), larger than 500 GHz at constant power, thanks to Piezo-based cavity length tuning. A frequency tunability of more than 500 GHz may also be achieved by combining piezo displacement of the second mirror 16 and tuning of the temperature of the semiconductor element 10.

A broader frequency tunability is even possible with mode hops.

The external cavity has a high finesse, superior to 600 (or 2000 for an anti-resonant design).

This configuration allows achieving:

a Side Mode Suppression Ratio at Quantum limit >45 dB.

a Polarization Extinction Ratio at Quantum limit >55 dB;

a weak Class B laser dynamics, with weak relaxation oscillations below 10 dB in RIN;

a good temporal coherence: RIN cavity cutoff of 500 MHz (or of 150 MHz for an anti-resonant design), shot noise 500 MHz (150 MHz for an anti-resonant design), linewidth 100 kHz (1 ms) with Quantum Limit<100 Hz;

a moderate output power (>5 mW without thermal management, >50 mW with structure bonded on high thermal conductivity substrate like Diamond or gold) a beam quality M2<1.5.

Figure 13:
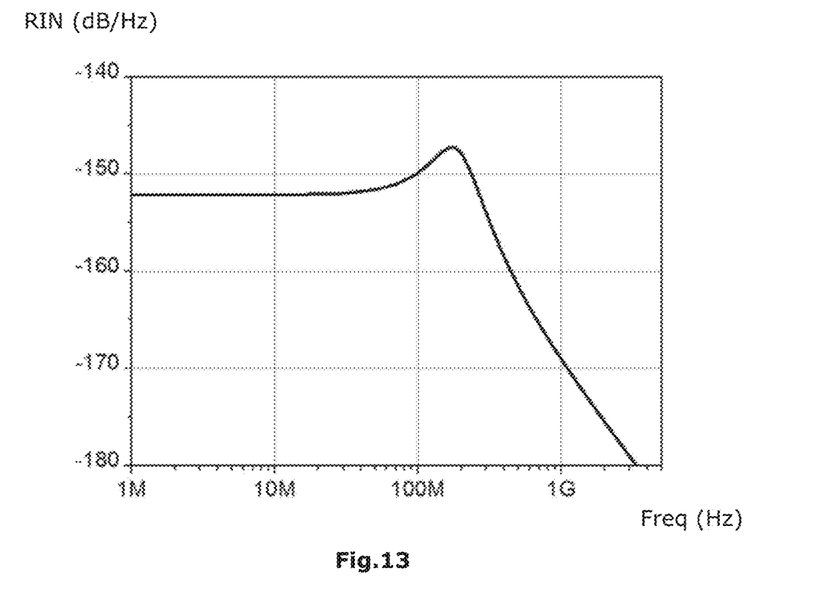
FIG. 13 shows an example of Relative Intensity Noise (dB/Hz) at quantum limit (pump RIN<−152 dB) as a function of radio frequency (Hz) of a 0.3 mm long anti-resonant VECSEL emitting 5 mW at 2.3 µm.
Figure 14:
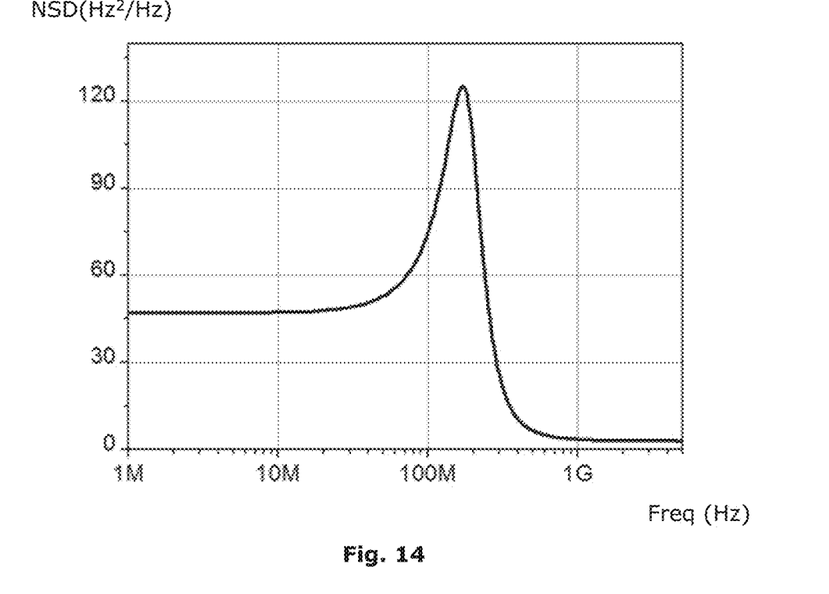
FIG. 14 shows an example of Frequency Noise Spectral density ($Hz^2$/Hz) at quantum limit as a function of radio frequency (Hz) of a 0.3 mm long anti-resonant VECSEL emitting 5 mW at 2.3 µm.

FIG. 13 illustrates an example of Relative Intensity Noise (dB/Hz) at quantum limit (pump RIN<−152 dB) plotted in function of the radio frequency RF (Hz), obtained with a device of the invention with a 0.3 mm long anti-resonant cavity emitting 5 mW at 2.3 μm. It can be seen that the shot noise for 1 mA of photocurrent is reached at 500 MHz here.

FIG. 9 illustrates an example of Frequency Noise Spectral density (Hz²/Hz) at quantum limit plotted in function of the radio frequency RF (Hz), obtained with a device of the invention with a 0.3 mm long anti-resonant cavity emitting 5 mW at 2.3 μm. The fundamental laser linewidth (FWHM) is thus 147 Hz here.

Figure 15:
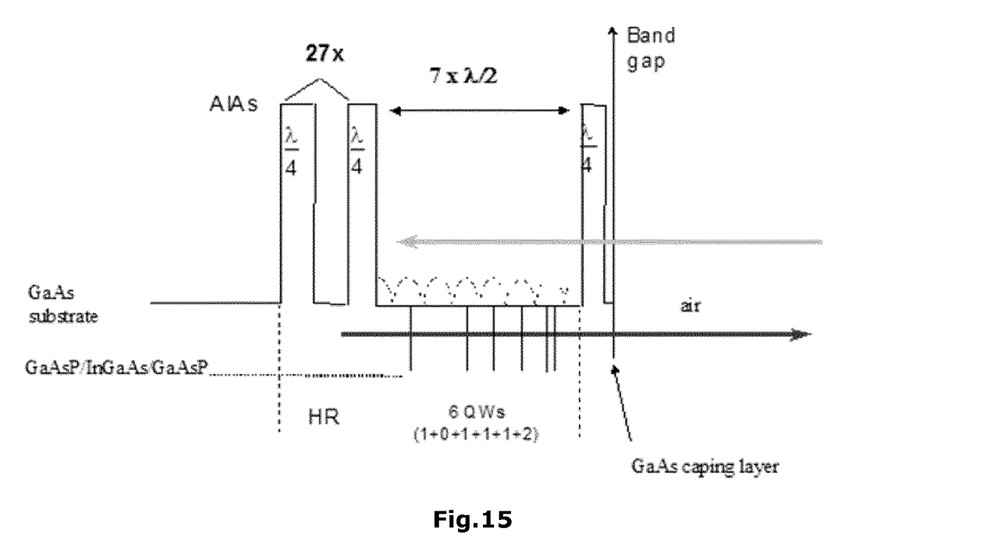
FIG. 15 shows a simple antiresonant design of the device according to a mode of realization of the invention and without the use of top Bragg mirror.
Figure 16:
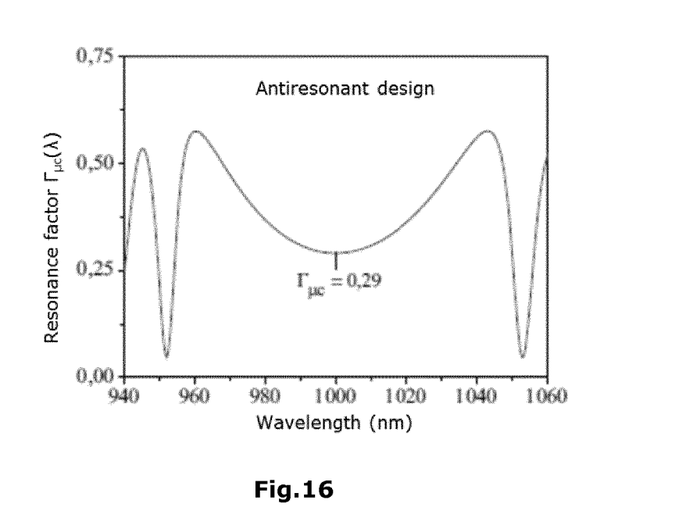
FIG. 16 shows the ratio between the light power inside the gain structure and through the external cavity as a function of wavelength for the antiresonant, for the design illustrated in FIG. 15.
Figure 17:
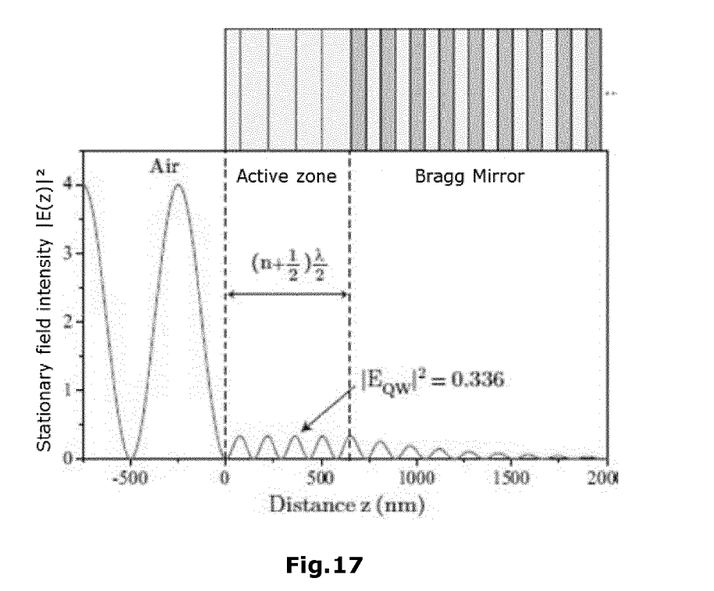
FIG. 17 shows the electric field density across such a design.
Figure 18:
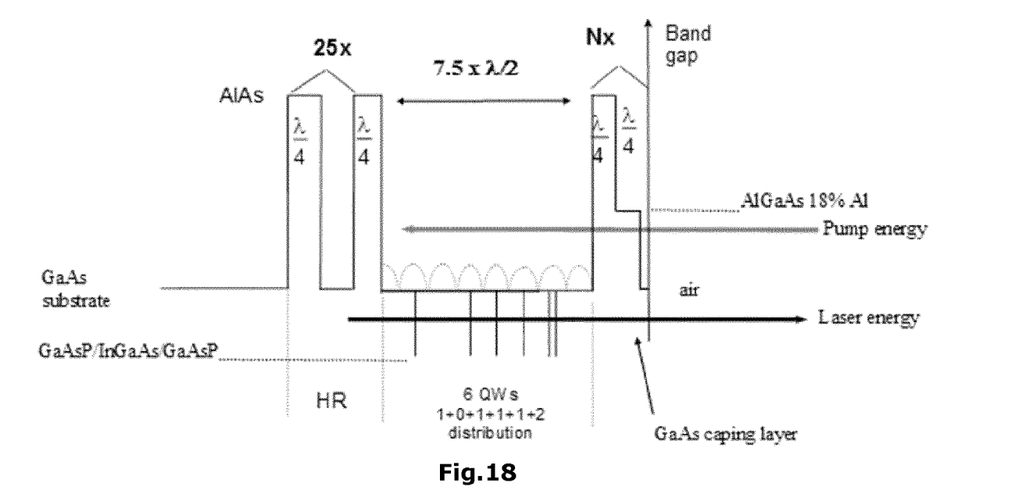
FIG. 18 shows an enhanced antiresonant design of the device according to another mode of realization of the invention and using a top Bragg mirror over the microcavity.

As an example of such designs of the laser device according to the invention, the following configurations may be implemented:

a simple antiresonant design, as illustrated in FIG. 15, with an odd number of λ/4 layers (equal to 15 in FIG. 16) located between the substrate and the caping layer, and without a Bragg mirror onto the top surface of the microcavity. It provides a broad tunable laser, with a large bandwidth, for which the ratio between the light power inside the optical microcavity and the light power inside the external cavity is equal to 0.3. The length of the external optical cavity may be typically included between 0.4 mm and 1 mm, which leads to a Free Spectral Range in the range of 150 GHz to 375 GHz and a net bandwidth comprised between 1 THz and 6 THz. FIG. 16 shows the ratio between the light power inside the gain structure and through the external cavity as a function of wavelength for such simple antiresonant design: as visible, the ratio is equal to 0.29 for λ=1000 nm. As explained before, it results from the intrinsic gain curve of the quantum wells and the length of the microcavity. FIG. 17 illustrates the electrical filed density across a simple antiresonant laser device.

an enhanced antiresonant design, as schematically illustrated in FIG. 18 with an odd number of λ/4 layers (equal to 15 in FIG. 18) located between the substrate and the caping layer, and with a Bragg mirror onto the top surface of the microcavity, composed with a pair number of λ/4 layers comprised between 1 and 10. Thus, the optical bandwidth of such design is broader than the modal gain bandwidth in order to keep anti-resonance condition across the full gain bandwidth and to allow broad temperature-based wavelength tuning. In this case, the ratio between the light power inside the optical microcavity and the light power inside the external cavity is equal to 0.1. The length of the external optical cavity may be typically included between 0.2 mm and 1 mm, which leads to a Free Spectral Range in the range of 150 GHz to 750 GHz and a net bandwidth comprised between 1 THz and 6 THz.

According to some variants:
the external cavity may be filled with any relevant medium such as vacuum, gel, liquid, or solid material,
the second mirror 16 may be of any usable shape. It may for instance be flat.

While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

The invention claimed is:

1. A laser device for generating an optical wave at a laser frequency, comprising:
    a semiconductor element comprising a gain region with quantum wells or quantum dots, said gain region being located between a first mirror and an exit region (14) defining an optical microcavity;
    a second mirror, distinct from the semiconductor element, and arranged so as to firm with the first mirror an external optical cavity including the gain region;
    means for pumping the gain region so as to generate the optical wave;
    a spectral ratio between the Half Width Half Maximum (HWHM) spectral bandwidth of the round trip net modal gain and a free spectral range of the optical microcavity and the external cavity is adjusted to be in the range of 2 to 50; and
    a ratio between the light power inside the optical microcavity and the light power inside the external cavity is lower than or equal to 1.

2. The device of claim 1, which comprises a spectral ratio in the range of 2 to 9.

3. The device of claim 1, which comprises a spectral ratio in the range of 11 to 50.

4. The device of claim 1, in which the length of the optical microcavity is adjusted so as to meet an anti-resonance condition at the laser frequency.

5. The device of any of the claim 1, in which the external optical cavity is adjusted to be smaller than or equal to 2 mm.

6. The device of claim 1, which comprises an exit region with a spectral filter arranged so as to enhance the anti-resonance factor of the micro-cavity around the laser frequency.

7. The device of claim 1, wherein the second mirror is a concave mirror.

8. The device of claim 1, which further comprises tuning means for moving the second mirror so as to change the length of the external cavity.

9. The device of claim 8, wherein the tuning means comprises a flexible part actuated by a piezo-electric actuator.

10. The device of claim 1, which comprises only free space between the exit region of the semiconductor element and the second mirror.

11. The device of which comprises a semiconductor element based on one of the following substrates:
    a III-V semiconductor;
    a IV semiconductor;
    a metallic type substrate;
    a gallium antimonide (GaSb) substrate; and
    a gallium arsenide (GaAs) substrate.

12. The device of claim 1, which further comprises optical pumping means with a pump laser arranged so that its beam falls on the exit region of the semiconductor element around the Brewster angle.

13. The device of claim 1, wherein the pump laser comprises at least one multimode continuous laser diode.

14. The device of claim 12, wherein the pump laser is arranged to that its beam covers an area of 25 μm² or more in the exit region.

15. The device of claim 12, which further comprises stabilization means for stabilizing the intensity of the pump laser beam.

16. The device of claim 15, wherein the stabilization means comprises a photodiode for measuring the intensity noise of the pump laser beam and a control loop for driving the pump laser so as to cancel said intensity noise.

17. The device of claim 1, which further comprises electrical pumping means for injecting a pump current in the semiconductor element.

18. A method for designing the tunable and robust laser device of claim 1 and operating at a single frequency, the method comprising at least one of the steps of:
adjusting in the range of 2 to 50 the spectral ratio between the Half Width Half Maximum (HWHM) spectral bandwidth of the modal gain and the free spectral range of the optical microcavity and the external cavity; and
adjusting the ratio between the light power inside the optical microcavity and the light power inside the external cavity in order to be lower than or equal to 1.

19. The method of claim 18 that further comprises the step of adjusting the length of the laser optical microcavity so as to meet an anti-resonance condition.

20. The method of claim 18 that further comprises the step of designing the external cavity in order to be smaller than or equal to 2 mm.

21. The method of claim 18, wherein the step of adjusting the ratio between the light power inside the optical microcavity and the light power inside the external cavity comprises the adjustment of the confinement factor.

22. The method of claim 18, wherein the step of meeting the anti-resonance condition is obtained by adjusting the total optical length of the microcavity to be an odd number of $\lambda/4$ layers and/or by placing a Bragg mirror onto the exit region to further enhance the anti-resonance of the microcavity.

* * * * *